United States Patent

[11] 3,563,443

[72] Inventors Donald G. Pedrotti
Cupertino;
Rainer Reimann, Saratoga, Calif.
[21] Appl. No. 808,416
[22] Filed Mar. 19, 1969
[45] Patented Feb. 16, 1971
[73] Assignee Hugle Industries, Inc.
Sunnyvale, Calif.

[54] PNEUMATIC FORCE-EXERTING SYSTEM
9 Claims, 3 Drawing Figs.

[52] U.S. Cl. .......... 228/1; 29/466, 29/470.1; 219/78; 228/5, 228/17, 228/44; 269/26
[51] Int. Cl. .......... B23k 1/06, B23k 5/20
[50] Field of Search .......... 228/1, 4, 5, 15, 17, 44; 269/26, 27; 29/464, 466, 470.1; 29/466, 29/470.1, 219/78; 228/5, 228/17, 228/44;

[56] References Cited

UNITED STATES PATENTS

| | | | |
|---|---|---|---|
| 3,442,432 | 5/1969 | Santangini .......... | 228/44 |
| 3,427,424 | 2/1969 | Kirchberger et al. .......... | 219/78 |
| 3,372,263 | 3/1968 | Lemelson .......... | 219/161X |
| 3,291,657 | 12/1966 | Bodine .......... | 219/86 |
| 2,968,712 | 1/1961 | Runkle .......... | 219/161X |
| 2,678,072 | 5/1954 | Verdeber .......... | 269/28 |

*Primary Examiner*—John F. Campbell
*Assistant Examiner*—Robert J. Craig
*Attorney*—Harry R. Lubcke

ABSTRACT: A system for exerting force in ultrasonic or thermocompression bonding of semiconductor structures. Clamping and leveling pneumatic pistons both supply a combined force initially to level deformable contacts upon a semiconductor chip to the plane occupied by connections upon a substrate by pressing the chip and substrate together. The leveling piston is then disengaged. Bonding is subsequently safely accomplished under a force exerted by only the clamping piston. A balance piston free-floats the chip bonding elements.

INVENTORS
DONALD G. PEDROTTI
RAINER REIMANN
BY Harry R. Lubcke
AGENT

INVENTORS
DONALD G. PEDROTTI
RAINER REIMANN
BY
Harry R. Lubcke
AGENT

PNEUMATIC FORCE-EXERTING SYSTEM

BACKGROUND OF THE INVENTION

The invention pertains to compound mechanical means for exerting force on a workpiece; particularly, for leveling and clamping electrical contacts on a semiconductor device preparatory to ultrasonic or thermocompression welding of the same to a substrate.

In this relatively new field of "flip-chip bonding" in the fabrication of integrated circuits, the prior art has been content to impose a force of only a single magnitude upon a chip and substrate, which comprise a workpiece. The force is exerted for the purpose of leveling the deformable contacts "-bumps" on the chip and also for subsequently welding the bumps to conductors on the substrate. A force of sufficient magnitude to level the bumps has frequently caused initially higher bumps to absorb too much ultrasonic energy during welding, thus to become detatched from the chip and spoil the work.

SUMMARY OF THE INVENTION

According to this invention, two force-exerting means are employed. Acting together these provide a force of sufficient magnitude for surely leveling the bumps, so that all of them will make contact with correspondingly positioned conductive paths on the substrate. One force-exerting means is then withdrawn and the typical process of ultrasonic bonding is safely performed. Destructive faults are thus avoided in the work. Additionally, because two cylinder-piston combinations are employed, a selected force is exerted on all of the work processed, despite variation of its thickness.

DESCRIPTION OF THE PREFERRED EMBODIMENT

Figure 1:
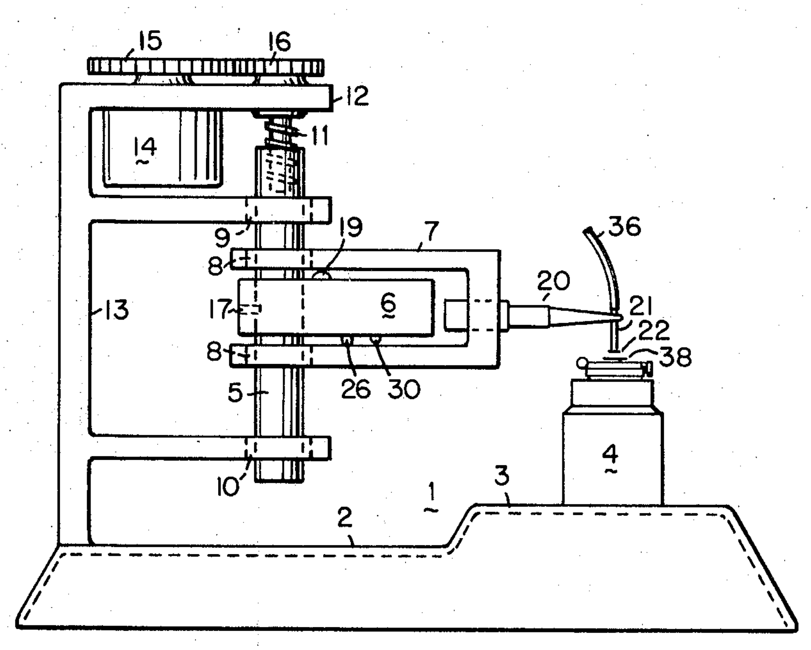
FIG. 1 is a side elevation of the whole device for exerting the forces according to this invention.

In FIG. 1, element 1 is the support means, taken as a whole. It is principally comprised of base 2, having a raised portion 3, a support 4 for the substrate (the larger piece to be joined), and a vertical support portion 13. Column 5 moves vertically in the latter, through relatively frictionless bearings 9 and 10. These bearings 8, 9, and 10 may have rollers bearing upon column 5 to allow its longitudinal translation with minimum friction.

A cantilever driven member 6 and a yoke 7 which encompasses it are attached to column 5 by relatively frictionless bearings 8 in the case of the yoke and by a rigid attaching means 17, such as an Allen setscrew, in the case of the driven member.

A driving means, screw 11, is driven through gear train 15, 16 by prime mover means, electric motor 14. The motor is supported by cap member 12, which is a part of support portion 13. Connection between screw 11 and column 5 is by means of female threads within column 5. Digital control may be connected to electric motor 14 for its control in the manner of known numerical control of a machine tool. Such control typically brings the two pieces of work essentially together and then backs off after the leveling process has been accomplished so that clamping while bonding may be accomplished at a reduced magnitude of force upon the work. Alternately, manual control may be used. Also, mechanically operated limit switches adjacent to the work may be used for motor control; one to stop the motor when the workpieces are essentially in contact and another to stop the withdrawal after manual operation of a withdraw switch.

Typically, gear 15 has a larger than gear 16 diameter. While this gives a speed increase, the screw 11 provides essentially a worm and gear ratio to the movement of column 5, which relatively slow movement is required so that the operator can follow the action.

Figure 2:
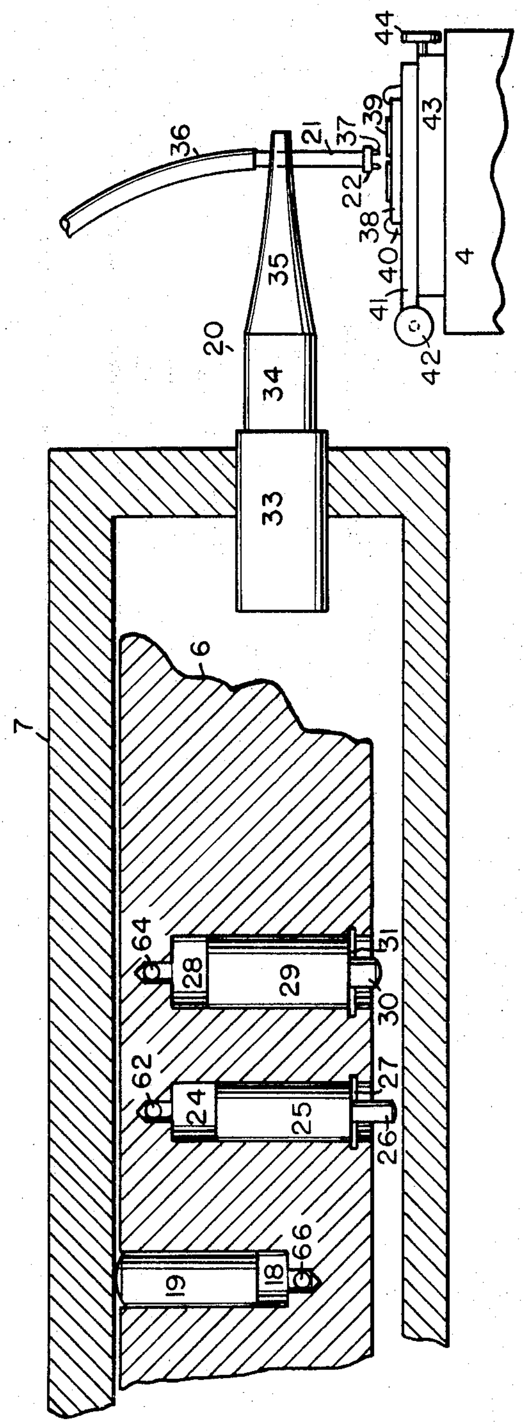
FIG. 2 is a sectional side elevation of the driven member, yoke, and associated elements particularly concerned in exerting forces.

The pneumatic cylinder-piston combinations are next in the kinematic chain. As best seen in FIG. 2, balance cylinder 18 is drilled and reamed into driven member 6 at a location along the member relatively near column 5. Piston 19 is provided therein, having a close sliding fit and being supplied with a dry lubricant such as Microseal, which is manufactured by the Microseal Corporation, to reduce static friction to a minimum. This cylinder is positioned in the upper part of the driven member and the top end of piston 19 bears against the underside of the upper arm of yoke 7.

This cylinder-piston combination functions to provide a force upward equal to the force of gravity downward upon the mass of yoke 7, transducer horn 20 and tool 21 plus hose 36, so that manipulation of chip 22 upon tool 21 by the action of further cylinder-piston combinations will be with reference to a net force upon the chip, uninfluenced by the one and one-half to two pound weight of the yoke, horn and tool elements recited.

Next in position away from column 5 is clamping cylinder-piston combination 24, 25, 26. Cylinder 24 is formed within the body of driven member 6, as before, but approximately at the center of the member, horizontally, and in the lower part thereof. Piston 25 is contained within the cylinder. An insert 27 provides a stop for the piston and prevents blowout of the same under test conditions in the absence of the yoke. Piston rod 26 extends beyond the piston and normally bears upon the bottom arm of yoke 7. The length of the rod is of the order of one-fourth inch. Piston 25 has a diameter of the same order as that of of piston 19, typically three-eights inches. The force provided by this combination tends to move the yoke downward with respect to the driven member.

Last in position away from column 5 is leveling cylinder-piston combination 28, 29, 30. Cylinder 28 is formed within the body of driven member 6, but slightly farther away from column 5 than cylinder 24, and also in the lower part thereof. Piston 29 is contained within cylinder 28. An insert 31 is provided at the bottom end of the cylinder, as before. Piston rod 30 extends beyond piston 29, but not as far as with the prior 25, 26 combination. Typically rod 30 is one-tenth of an inch shorter than rod 26. This allows selective application of force from either one or both pistons, as will be detailed later.

Piston 29 is of larger diameter than is piston 25; having a diameter of, say, one-half inch. With the same pneumatic pressure in each cylinder, this makes possible a greater magnitude of force being exerted by piston 29. While these pressures may be adjusted by means to be described in connection with FIG. 3, it is desirable that the capability of exerting greater force be available at the leveling piston 29, since the leveling operation requires the largest magnitude of force in the processes involved.

In the typical ultrasonic bonding application of the pneumatic force-exerting system of this invention, a transducer horn 20 is rigidly fastened to yoke 7 at the end thereof away from column 5. This is a clamped fit of the larger diameter part 33 of the horn within a hole in the yoke. Further colinear parts of the horn; smaller diameter part 34 and conical part 35, contain ultrasonic vibration-generating means (known, not shown), to provide longitudinal motion of small amplitude of beyond audible frequency for accomplishing welding.

A relatively small square or round tool 21 is rigidly affixed at right angles to the axis of horn 20. It is typically hollow, so that a vacuum can be maintained at the lower end thereof by a connection through flexible hose 36 to a known vacuum pump (not shown). A chip 22, forming the upper part of the work to be welded, is shown held in place at the lower end of the tool, with downwardly projecting bumps 37. These are shown larger than actual, for sake of clarity.

Also best shown in FIG. 2, substrate 38 is shown with conductive ink paths 39 larger than actual, for sake of clarity. The substrate is normally clamped to support 4 through certain intermediaries; clamp 40, stage 41, having adjusting means 42 to give translation in the Y direction, and stage 43, having adjusting means 44 to give translation in the X direction. Alternatively, the function of clamp 40 may be accomplished by a vacuum made available just below substrate 38 through the stages and support 4. A rotational adjustment may also be provided below stage 43.

Figure 3:
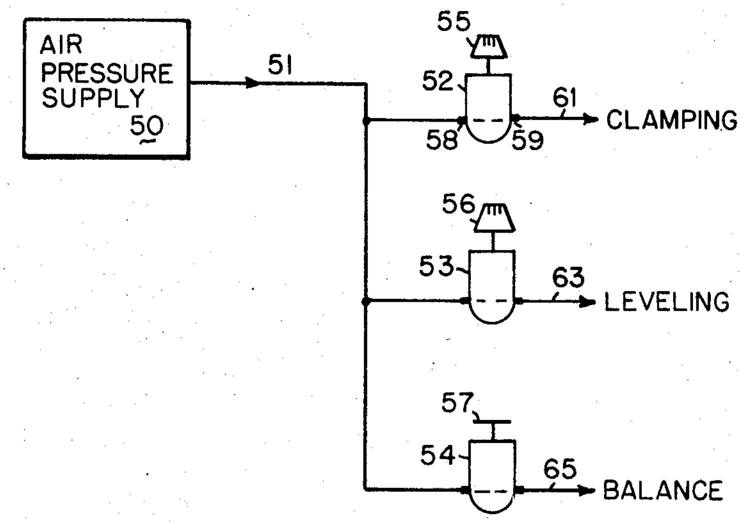
FIG. 3 is a schematic diagram of the pneumatic system for energizing the pistons which exert the forces.

In the pneumatic system shown in FIG. 3, a known source of regulated and filtered air pressure 50 provides a pressure of approximately 30 pounds per square inch to actuate cylinders 18, 24 and 28 of FIG. 2. Tubing 51 connects source 50 to three normally identical pressure regulators 52, 53, 54. These may be a known type, such as those made by Minneapolis-Honeywell, having pressure-adjusting knobs 55, 56, 57, respectively. These each bear upon a spring internal to the regulator, to adjust the compression thereof. The spring, in turn, bears upon a diaphragm and connected thereto is a valve which is in the path between inlet 58 and outlet 59, for example, in each of the devices.

Air pressure from regulator 52 is conveyed through tubing 61 to inlet port 62 of clamping cylinder 24 (See FIG. 2). A typical pressure range for actuating the piston of this cylinder is from 0 to 30 pounds per square inch. Similarly, air pressure from regulator 53 is conveyed through tubing 63 to inlet port 64 of leveling cylinder 28. A typical pressure range for actuating the piston of this cylinder is from 0 to 30 pounds per square inch. Further, air pressure from regulator 54 is conveyed through tubing 65 to inlet port 66 of balance cylinder 18. A typical pressure for actuating the piston of this cylinder is 20 pounds per square inch.

OPERATION

In a typical operation, an integrated circuit substrate 38 having resistive, capacitive and perhaps diode elements, along with a printed circuit of conductive ink (of which 39 is illustrative) is fastened in clamp 40 and suitably positioned in the horizontal plane by the use of X and Y adjustments 44 and 42. This for the purpose of positioning the substrate such that the three or four usual connections that are to be made to bumps 37 on the chip 22 are aligned with corresponding paths of conductive ink or equivalent on the substrate. Prior to this aligning step the chip has been picked up from a number of chips awaiting processing by lowering tool 21 over one of them and establishing a vacuum at the lower end of tool 21 through hose 36.

The tool with the chip attached is then brought down over the substrate until the two just touch by means of the electric motor 14 and associated means that have been described. Balance piston 19 is continuously pneumatically energized so that yoke 7 and its attachments are essentially weightless.

By moving member 6 slightly farther downward after the chip bumps 37 touch ink paths 39 piston rod 26, or subsequently both 26 and 30, are selectively depressed against the bottom arm of yoke 7. In normal processing, both cylinders 24 and 28 have pneumatic pressures appropriate to the number of bumps 37 to be welded and both piston rods 26 and 30 initially bear upon the lower surface of yoke 7. This accomplishes the leveling step in the processing. Such individual bumps 37 as are too long are deformed by a relatively large amount and all others are at least slightly flattened so that all will be in contact with ink paths on the substrate. In this way a proper bond (weld) is subsequently accomplished for all bumps.

It will be recalled that piston rod 30 is one-tenth inch shorter than piston rod 26. After a brief interval of simultaneous exertion of force by both pistons, say ten milliseconds, driven member 6 is raised (retracted) a preset amount, say one-twentieth of an inch, so that only piston rod 26 bears upon yoke 7. In this way, the position of driven member 6, controlled by suitably energizing motor 14, determines what magnitude of force will be exerted on the work.

In the second step, when only clamping piston rod 26 is exerting the force between chip 22 and substrate 38, a source of ultrasonic electrical energy (not shown) is energized. This horizontally vibrates transducer horn 20 and thus bonds bumps 37 to conductors 39. Any commercially available source of ultrasonic energy is suitable, such as those manufactured by Sonobond Corporation, UTI Corporation or Buyfield Corporation.

The provision of plural pressure pistons has an advantage in that the forces exerted on the work are the same regardless of minor differences in the thickness of the work from one piece to the next. This occurs because the force on yoke 7 is constant (near zero) until yoke 7 touches rod 26, then it is constant (at a higher value) until yoke 7 touches piston rod 30, at which time the total force is the sum of all forces.

ALTERNATE EMBODIMENTS

In its general form the invention may be employed to give controlled forces upon any type of workpieces, large or small.

In an alternate mode of operation, the force exerted by leveling piston 29 on yoke 7 may be removed by reducing the pneumatic pressure thereon to zero or substantially zero by adjusting pressure regulator 53. The clamping and bonding action then takes place. The pressure may be reduced manually, or an automatically actuated solenoid may actuate pressure reducer 53.

Also, thermocompression bonding may be employed. In this instance, horn 20 is replaced by a similar element which can be heated. The temperature of bumps 37 and consequentially conductive paths 39 are then heated and pressure applied according to the known thermocompression technique. The power supply and heatable tip may be those available from the Weltek Division of Wells Electronics, Inc., Indiana.

We claim:

1. Mechanical means for exerting a force having plural successive amplitudes for bonding workpiece (22,38) comprising:

a. support means (1,13) for said mechanical means and said workpiece;

b. a moveable member (7), having a connection (6,5,11) to said support (13) for exerting said force;

c. first pneumatic means (24,25,26) to bear upon said moveable member (7) for exerting a first magnitude of force upon said workpiece;

d. second pneumatic means (28,29,30) to bear upon said moveable member (7) for exerting a second magnitude of force upon said workpiece in addition to said first magnitude of force, to increase the total magnitude of force upon said movable member;

e. controllable power means (14) to retract said connection (6,5,11) subsequent to the exertion of said second magnitude of force, whereby said second magnitude of force is no longer exerted upon said moveable member and therethrough no longer exerted upon said workpiece; and means operable under said first magnitude of force.

2. The mechanical means of claim 1 in which said connection comprises; an axially translatable column (5), a driven member (6) attached to said column (5) and bearing upon said moveable member (7) through said first and second pneumatic means; and axial translating means (11) connected to said column (5) and to said support means (13) to translate said column with respect to said support means (13).

3. The mechanical means of claim 2, which additionally includes; low friction means (8) connecting said moveable member (7) to said column (5), and further low friction means (9,10) connecting said column (5) to said support means (13).

4. The mechanical means of claim 2, in which said first pneumatic means comprises; a first cylinder (24) within said driven member (6), and a first piston (25) having a piston rod

(26), said first piston being within said first cylinder and said piston rod being sufficiently long to contact said moveable member (7) when the combination of said first cylinder and said first piston is pneumatically energized.

5. The mechanical means of claim 2, in which said second pneumatic means comprises; a second cylinder (28) within said driven member (6), and a second piston (29) having a piston rod (30), said second piston being within said second cylinder and the piston rod (30) of said second piston (29) being shorter than the piston rod (26) of said first piston, and sufficiently long to also contact said moveable member when the combination of said second cylinder and said second piston is pneumatically energized.

6. The mechanical means of claim 5, in which the diameter of said second cylinder (28) is larger than the diameter of said first cylinder (24).

7. The mechanical means of claim 2, which additionally includes; third pneumatic means (18,19) disposed oppositely with respect to said first and second pneumatic means within said driven member, to oppositely bear upon said moveable member (7) for counterbalancing the weight thereof.

8. The mechanical means of claim 5, in which said controllable means comprises a pneumatic device (53) for removing pneumatic pressure from said second cylinder (28).

9. The mechanical means of claim 1, which includes ultrasonic bonding means (20,21) attached to said moveable member (7), operable to bond said workpiece (22,38) when said second magnitude of force is no longer exerted.